United States Patent [19]
Carlomagno et al.

[11] Patent Number: 5,189,507
[45] Date of Patent: Feb. 23, 1993

[54] INTERCONNECTION OF ELECTRONIC COMPONENTS

[75] Inventors: William D. Carlomagno, Redwood City; Dennis E. Cummings, Placerville; Alexandru S. Gliga, San Jose, all of Calif.

[73] Assignee: Raychem Corporation, Menlo Park, Calif.

[21] Appl. No.: 713,024

[22] Filed: Jun. 7, 1991

Related U.S. Application Data

[60] Continuation of Ser. No. 503,508, Apr. 2, 1990, abandoned, which is a division of Ser. No. 151,131, Feb. 1, 1988, Pat. No. 4,955,523, which is a continuation-in-part of Ser. No. 942,665, Dec. 17, 1986, abandoned, which is a continuation-in-part of Ser. No. 942,667, Dec. 17, 1986, abandoned, which is a continuation-in-part of Ser. No. 15,550, Feb. 13, 1987, abandoned.

[51] Int. Cl.$^5$ .................. H01L 23/12; H01L 23/54
[52] U.S. Cl. ................................ 257/777; 257/724
[58] Field of Search .................. 357/67, 69, 70, 80, 357/75, 65; 228/179, 180.1, 180.2, 127, 173.1, 174, 173.5, 179, 180.2; 437/182, 183, 184, 185, 187, 188, 209, 211, 212

[56] References Cited

U.S. PATENT DOCUMENTS 3,075,282  1/1963  McConville .................. 29/155.55

(List continued on next page.)

FOREIGN PATENT DOCUMENTS

| | | |
|---|---|---|
| 3305952 | 8/1984 | Fed. Rep. of Germany . |
| 147293 | 3/1981 | German Democratic Rep. . |
| 0038884 | 3/1977 | Japan .................. 357/69 |
| 44901 | 12/1978 | Japan . |
| 53-44901 | 12/1978 | Japan . |
| 83245 | 6/1980 | Japan . |
| 55-83245 | 6/1980 | Japan . |
| 155736 | 9/1982 | Japan . |
| 57-155736 | 9/1982 | Japan . |
| 59-029496 | 2/1984 | Japan . |
| 33249 | 8/1984 | Japan . |
| 59-033249 | 8/1984 | Japan . |
| 59-208751 | 11/1984 | Japan . |
| 76934 | 5/1985 | Japan . |
| 60-76934 | 5/1985 | Japan . |
| 60-089951 | 5/1985 | Japan . |
| 60-134444 | 7/1985 | Japan . |
| 60-5546 | 12/1985 | Japan .................. 357/67 |
| 61-91939 | 5/1986 | Japan . |
| 91939 | 5/1986 | Japan . |
| 1056362 | 1/1967 | United Kingdom . |
| 2036624 | 7/1980 | United Kingdom . |
| 2095473 | 9/1982 | United Kingdom . |
| 2142568 | 1/1985 | United Kingdom . |
| 2151529 | 7/1985 | United Kingdom . |

OTHER PUBLICATIONS

"Study of Aluminum Ball Bonding for Semiconductors"-Onuki et al.-34th Electron. Compon. Conf., May 14-16, 1984 (New Orleans), pp. 7-12 (IEEE 1984).
Brown, "Low Cost Pin Grid Array Packages," Solid State Technology, May 1985, pp. 239-241.
"New Semiconductor Bonding Technique," Electronic Technician, Sep. 1957, p. 71.
Ng, IBM Technical Disclosure, "Chip-to-Pin Carrier Interconnection Systems," vol. 21, No. 7, pp. 2707-2708, Dec. 1978.
Miller, IBM Technical Disclosure, "Cutting Fine Lead Wires After Ultrasonic Bonding," vol. 10, No. 3, p. 190, Aug. 1967.

*Primary Examiner*—Rolf Hille
*Assistant Examiner*—S. V. Clark
*Attorney, Agent, or Firm*—Yuan Chao; Herb Burkard

[57] ABSTRACT

The invention provides a technique for interconnecting electronic components in which interconnection wires are bonded to contacts on a first component without the use of a material other than the materials of the contacts and the wires; the wires are then severed to a desired length of between 2d and 20d, where d is the diameter of the wires, and bonded to contacts on the second component by means of a conductive material such as solder. Preferably, solder is provided as pools located in recesses in a layer of insulating material. The invention also provides a bonding head for a wire bonder for bonding the wire to the contact on the first component and for weakening or severing the wire at the desired point.

16 Claims, 2 Drawing Sheets

U.S. PATENT DOCUMENTS

| | | | |
|---|---|---|---|
| 3,202,489 | 8/1965 | Bender et al. | 29/195 |
| 3,286,340 | 11/1966 | Kritzler et al. | 29/471.1 |
| 3,296,692 | 1/1967 | Griffin | 29/472.9 |
| 3,373,481 | 3/1968 | Lins et al. | 29/471.3 |
| 3,376,635 | 4/1968 | Moesker | 29/471.1 |
| 3,392,442 | 7/1968 | Napier et al. | 29/628 |
| 3,397,451 | 8/1968 | Avedissian | 29/589 |
| 3,672,047 | 6/1972 | Sakamoto et al. | 29/628 |
| 3,719,981 | 3/1973 | Steitz | 29/423 |
| 3,811,186 | 5/1974 | Larnerd et al. | 29/626 |
| 3,921,285 | 11/1975 | Krall | 29/626 |
| 4,067,104 | 1/1973 | Tracy | 29/626 |
| 4,142,288 | 3/1979 | Flammer et al. | 29/628 |
| 4,326,663 | 4/1982 | Oettel | 228/123 |
| 4,332,341 | 6/1982 | Minetti | 228/180 A |
| 4,354,310 | 10/1982 | Hatton | 29/605 |
| 4,374,457 | 2/1983 | Wiech, Jr. | 29/991 |
| 4,412,642 | 11/1983 | Fisher, Jr. | 228/173 R |
| 4,417,392 | 11/1983 | Ibrahim et al. | 29/840 |
| 4,419,818 | 12/1983 | Grabbe | 29/832 |
| 4,422,568 | 12/1983 | Elles et al. | 228/111 |
| 4,442,938 | 4/1984 | Murphy | 206/329 |
| 4,447,857 | 5/1984 | Marks et al. | 361/395 |
| 4,520,561 | 6/1985 | Brown | 29/840 |
| 4,542,438 | 9/1985 | Yamamoto | 361/403 |
| 4,547,833 | 10/1985 | Sharp | 361/386 |
| 4,641,426 | 2/1987 | Hartman et al. | 29/839 |
| 4,657,172 | 4/1987 | Lee | 228/180.2 |
| 4,661,192 | 4/1987 | McShane | 156/292 |
| 4,708,885 | 11/1987 | Saito et al. | 427/58 |
| 4,732,313 | 3/1988 | Kobayashi et al. | 228/179 |
| 4,746,300 | 5/1988 | Thevenin | 439/82 |
| 4,818,728 | 4/1989 | Rai et al. | 357/80 |
| 4,845,542 | 7/1989 | Bezuk et al. | 357/68 |

INTERCONNECTION OF ELECTRONIC COMPONENTS

CROSS-REFERENCE TO RELATED APPLICATIONS

This application is a continuation of application Ser. No. 07/503,508, filed Apr. 2, 1990 now abandoned; which is a division of application Ser. No. 07/151,131, filed Feb. 1, 1988, now U.S. Pat. No. 4,955,523; which is a continuation-in-part of application Ser. Nos. 06/942,665, filed Dec. 17, 1986, now abandoned, 06/942,667, filed Dec. 17, 1986, now abandoned, and 07/015,550, filed Feb. 13, 1987, now abandoned; the disclosures of which are incorporated herein by reference.

BACKGROUND OF THE INVENTION

This invention relates to the interconnection of electronic components such as for example integrated circuit (IC) chips, chip carriers, printed circuit boards and, in particular, to methods of forming an interconnection wire on a contact on an electronic component, methods of interconnecting contacts on first and second electronic components, a bonding head for a wire bonder and electronic components per se.

As the size of electronic components is reduced due to advances in the techniques by which they are manufactured, the density with which such components can be arranged in a piece of equipment becomes increasingly dependent on the space required to form interconnections to contacts on the components. A commonly used technique involves fastening a component such as an IC chip to a substrate such as a printed circuit board by means of an adhesive. Interconnection wires are each bonded at one end to a respective contact on the component by thermocompression wire bonding (which uses a combination of heat and pressure to form a weld), and are bonded at or towards their other end to a respective contact on the substrate, again generally by thermocompression wire bonding. A significant disadvantage of this technique is that the area occupied by the installed component with its interconnnections is significantly greater than the area of the component itself. The configuration of an interconnection made by this technique will be as disclosed in U.S. Pat. No. 4,417,392.

An interconnection technique which reduces the space required to form the interconnections to a component involves the formation of "bumps" of a conductive material on the contacts of either the component or the substrate to which the component is to be connected. The bumps allow connections to be made between the contacts on the component and contacts on the substrate which are directly opposite the component contacts. Generally, the bumps comprise a solder material and are applied to contacts by plating. Connection of a bump to a second contact can then be achieved by reflowing the solder. It is also known to form bumps by forming a bond between a ball on the end of a length of wire and a contact by thermocompression wire bonding, and breaking the wire immediately above the ball. A connection between the ball and a second contact can then be made by means of a welding technique such as ultrasonic bonding. This technique is disclosed in JP-A-59.208751, JP-A-80.089951 and JP-A-60.134444.

Interconnections between electronic components which are formed by means of bumps suffer from the disadvantage that frequently they are not sufficiently compliant to withstand forces exerted on thermal cycling, which can result in differential expansion of the components and breakage of at least some of the interconnections.

U.S. Pat. No. 3,373,481 discloses a technique for securing conductive pedestals to terminal elements of an integrated circuit device, which comprises thermocompression bonding gold spheres onto the terminals using a tool which, deforms the spheres into elongate pedestals The pedestals are connected to interconnect areas on a printed circuit board by means of a solder in which the gold of the pedestals dissolves. The application of this technique to densely packed contacts is limited by the accuracy with which the tool used to deform the spheres can be manufactured. Furthermore, the disclosed technique relies on dissolution of the material of the pedestals in order to ensure that they are of approximately equal height and therefore that interconnections can be made between all of the pedestals and respective contacts which lie in a single plane. This has the disadvantage that the resulting joint between the pedestals and the solder is embrittled on dissolution in the solder and, moreover, if it is desirable or necessary to break the solder connections and subsequently to remake them (for example for repair), the length of pedestal remaining for such subsequent connection is reduced.

DESCRIPTION OF THE INVENTION

We have devised a technique for interconnecting electronic components in which interconnection wires are bonded at one end to contacts on a first component, cut to a predetermined length and bonded to contacts on a second component by means of a material which is different from the materials of the wires and the contacts.

In one aspect, the invention provides a method by which an interconnection wire may be formed on a contact on an electronic component, comprising bonding a wire to the contact without the use of a material other than the materials of the contact and the wire and severing the wire to leave an interconnection wire bonded to the contact and having a free end, the length of the interconnection wire, measured from the contact or, if a portion of the interconnection wire is broadened in the vicinity of the contact, from a point immediately above any such broadening, being from about 2d to about 20d where d is the diameter of the interconnection wire.

The use of wire to form means for interconnecting contacts on electronic components has many advantages over conductive pedestals formed by deforming gold spheres. In particular, the technique of the present invention is applicable to wires having diameters as small as 75 micrometers or less without the need to make intricate and very small scale tools. The technique is very adaptable and does not require different tools for each configuration of component. The technique allows interconnection wires to be made more reproducibly to a desired length than is possible by deforming gold spheres and therefore removes the need to use a solder to dissolve the material of the interconnection means which, as discussed above, has significant disadvantages.

The ease with which connections can be made to the interconnection wires of the present invention, arising from their reproducible length, has the significant advantage that it allows connections to be made to contacts on an electronic component for testing purposes; the fact that it is not necessary to dissolve the end portions of the wires in a solder to make their lengths equal means that the wires maintain their full length after testing for subsequent interconnection to another electronic component.

The interconnection technique of this invention allows a higher density of interconnections to be achieved than has been possible hitherto, and furthermore, its applicability is not restricted to electronic components with a maximum number of contacts. This is in contrast to the technique in which a component is connected to a substrate (on which it is mounted) by wires having a wire bond at each end, in which the contacts have generally to be around the perimeter of the component; thus according to the present invention wire bonding techniques can be used to provide an array of interconnection wires on a component, or a component having multiple rows of interconnection wires around its perimeter. It is in contrast to connections made by means of bumps, which generally are applicable only to components with a small size because of their inability to withstand expansion and contraction of the connected components on thermal cycling. It is also in contrast to the technique of making interconnections by means of moulded pedestals because of the difficulty of machining and maintaining clean moulds to the small sizes of wires which are used in the present technique.

The contact on the surface of the component, to which the interconnection wire is or is to be connected, may be in the form of, for example, a pad, or an end of a conductive trace which runs parallel or perpendicular (or at an angle between the two) to the surface, such as a via. It may be recessed, coplanar with the surrounding surface of the component, or it may stand proud of the surface.

The bond between the wire and the contact, which is made without the use of a material other than the materials of the contact and the wire, will generally be a weld. The bond may be formed by the application of one or a combination of heat, pressure and vibration, for example, by thermocompression bonding which utilizes a combination of heat and pressure, or by thermosonic or ultrasonic bonding which utilize a combination of heat, pressure and vibration. It will be understood that incidental amounts of materials other than the materials of the wire and the contact, such as for example surface preparation agents, reaction products and contaminants such as oxide coatings and the like, may be present in or around the bond.

The bond may be formed between the circumferential surface of the wire and the contact, the wire being bent adjacent to the bonded portion so that it extends away from the contact. This is generally known as "wedge bonding".

More preferably however, the bond is formed between the end of the wire and the contact. This technique generally involves heating the wire at or near its end to form a ball. The bond is then formed between the ball and the contact. The heat may be applied to the end of the wire by means of an electric arc extending between an electrode and the wire. The wire is supplied from the wire bonder through a bonding head which is generally referred to as a capillary and which has a through passage through which the wire passes. This technique is generally known as "ball bonding".

The wire which is used to form interconnection wires in accordance with the present invention will be as fine as possible consistent with the mechanical and electrical requirements placed upon it when in use, and on the requirements for handling it and for bonding it to the contacts. Generally, the wire will be substantially round and will have a diameter of less than about 375 micrometers (microns), preferably less than about 250 microns. Particularly preferred wire has a diameter of from about 12 to about 125 microns, especially from about 25 to about 75 microns.

The material of the wire will be selected according to the techniques by which the interconnections between it and the contacts on the electronic components are to be made. The wire should be capable of bonding to the material of one of the contacts without the use of another material, and for this reason, aluminum, gold and copper wires are preferred, hard drawn gold wire being particularly preferred.

The length of the interconnection wire is measured from the contact unless a portion of the interconnection wire is broadened in the vicinity of the contact, as would be the case when the bond is formed by, for example, ball bonding or wedge bonding. In this event, the length of the interconnection wire is measured from a point immediately above any such broadening. For example, when the bond is formed by ball bonding, the length of the wire will be measured from the point where the wire enters the ball; the surface of the ball may be concave or convex at that point. When the bond is formed by wedge bonding, the length of the wire will be measured from the point where the portion of wire bonded to the contact meets the portion of wire extending away from the contact.

It is preferred that the length of the interconnection wire is from about $3d$ to about $12d$, preferably from about $5d$ to about $7d$. Interconnection wires having a length within the specified range, and particularly within the specified narrow range, have a particularly advantageous combination of properties. On the one hand, the wires are sufficiently compliant to be able to accommodate forces exerted due to thermal cycling of the interconnected components, relatively long interconnection wires being preferred for interconnecting large components. Moreover, interconnection wires with lengths falling within the above ranges are sufficiently strong to be able to support an electronic component on top of a substrate, while still allowing for the thermal effects as discussed above. The mechanical properties of the interconnection wires can be adjusted to suit the requirements of a particular application by appropriate selection of the shape, material, processing (which can affect, inter alia, the hardness and modulus of the wire), and length of the wires. Yet another advantage of such wires is that they have a very much shorter length than the wires used in the prior art techniques discussed previously in which the wires extend from a first component to contacts on a substrate on which the first component is mounted. Shortening of the wires alleviates undesirable reactance characteristics and allows the rate of signal transmission between components to be increased. Another significant advantage of the technique of this invention over this prior art technique is of course that the space required to make the interconnections between electronic components is significantly reduced.

When the bond between the wire and the contact is formed by ball bonding, it is preferred that the height of the ball above the contact (measured to the point furthest from the contact) is from about 1d to about 3d.

The wire may be severed directly to a desired length. Alternatively the wire may be severed by being weakened at a point a desired distance from the bond to the contact in such a way that it breaks under an applied force at the point at which it has been weakened. The wire may be weakened first, so that it breaks when a force is applied subsequently. Alternatively, the force may be applied to the wire which is then weakened while the force is being applied. The force which is applied to the wire is sufficient to break the wire at the point at which it has been weakened but should not be so great that the bond between the wire and the contact is broken. The combination of applying a force to the wire and then weakening the wire to cause it to break at a predetermined point has the advantage that it is a particularly convenient way to break wires to a repeatable length. Furthermore, localised necking of the wire caused by the application of force results in the wire being tapered over a short distance at its free end. This has the advantage that it facilitates location of the free end of the wire in an appropriately located quantity of conductive material, particularly when the conductive material is located in a recess as described in more detail below. Moreover, a bond between interconnection means and a pool of conductive material is inherently stronger if the interconnection means has a constant cross-section since applied tension puts the bond under an exclusively shear load. Furthermore, a wire having a tapered end portion can be inserted into a mechanical connector, the contact cross-section portion of the wire allowing a reliable connection to be made to the wire.

It is preferred that the method includes the step of applying force to the wire. When the wire is severed directly to a desired length, an applied force can serve to remove any kinks or set in the wire.

A significant advantage of the application of force to the wire is that it helps to straighten the wire, in particular to remove any curl in the wire, and thereby reduces the chance of two or more interconnection wires contacting one another and forming a short circuit.

Another advantage of applying force to the wire is that the bond between the interconnection wire and the contact is tested mechanically automatically during the assembly process.

Yet another advantage of the application of force to the wire is that it work-hardens the wire, thereby restoring at least partially its metallurgical properties which had been previously affected when it was heated, for example to cause it to bond to the contact or to weaken it.

The problem of curl in a wire is particularly prevalent when the wire has been supplied and stored on a reel The method of forming interconnection wires of this invention is capable of solving this problem elegantly, while also allowing wires to be cut reproducibly to a desired length.

The direction in which the interconnection wire extends from the contact can be selected by appropriate application of force. Preferably the interconnection wire extends in a direction away from the contact at an angle of less than about 30°, especially less than about 5°, to a line that is perpendicular to the contact at the point at which the wire is bonded thereto. It is especially preferred that the wire extends in a direction that is substantially perpendicular to the contact at the point at which it is bonded thereto. While it is preferred that the interconnection wires be straight and extend in a direction perpendicular to the contact, the wires may be inclined at any desired angle, by being bonded at that angle or being bent to that angle after bonding, and they may be curved, provided that the wires are maintained a sufficient distance apart to avoid contact with one another or with contacts or other conductive elements which would lead to a short circuit.

Preferably a wire bonder is used to form the interconnection wire. Wire may be supplied to the contact through a through passage n a bonding head, and one or more of heat, pressure and vibration may be applied to the wire to make the bond via the bonding head.

The bonding head may be provided with means for weakening the wire at a predetermined point relative to the opening through which the wire leaves the passage. Preferably, the wire is weakened at a point within the capillary.

In another aspect, the invention provides a bonding head for a wire bonder, having a tubular passage extending through it through which wire can be supplied for bonding to a contact on an electronic component, and having means for weakening the wire at a predetermined point relative to the opening through which the wire leaves the passage.

The means for weakening the wire preferably comprises a heat source for localized application of heat to the wire. For example, it may comprise an electrode arranged for generation of an electric arc between the electrode and the wire, or it may comprise a laser or an electrical resistance heater. The laser or arc electrode may operate independently of or in conjunction with another heat source, or another weakening means.

The means for weakening the wire may comprise an element which is arranged to contact the wire to create a point of weakness therein. The element may create a notch in the wire or it may sever the wire directly. The element may comprise for example a blade or a wire. The element may also comprise a heat source, for example a heated blade or wire.

The weakening means is preferably arranged so that the wire is weakened at a point within the bonding head. This has significant advantages. For example, it enables the wires to be cut reproducibly to a desired length by resting the bonding head on the contact, or on a broadened portion of the wire in the vicinity of the contact; cutting the wire with the bonding head in this position ensures that the wire has a predetermined length measured from the contact or from a point immediately above the broadened portion of the wire. Moreover, weakening the wire within the bonding head allows better control over any debris resulting from the weakening step; it is highly undesirable that any such debris should fall onto the component to which the wire is bonded where it could form a short circuit. The weakening means may be so arranged by being positioned in an aperture in the wall of the bonding head which communicates with the through passage.

Preferably, the internal diameter of the through passage is substantially constant over a distance, on each side of the point at which the wire is weakened, more preferably of at least about x, especially of at least about 2.5x, more especially of at least about 4x, where x is the internal diameter of the passage at the said point. This feature has been found to contribute to the accuracy with which the wire can be cut since the wire is less able to move laterally within the through passage than in a conventional bonding head in which the through passage is flared outwardly from a point only a short distance above the opening from which the wire leaves the passage. As an example, in a bonding head for wire having a diameter of 50 microns, the diameter of the through passage at the opening will generally be about 60 microns. In this case it is preferred that the diameter of the passage be about 60 microns over a portion of its length at least about 125 microns, especially at least about 250 microns, on each side of the means for weakening the wire.

The weakening means may be positioned externally of the bonding head, preferably on an external surface. For example, when the weakening means comprises an electrode for generating an electric arc, it may be provided by a stripe of a conducting material such as a conducting paint. An advantage of an electrode positioned externally of the bonding head is that it is relatively convenient to manufacture the bonding head. Furthermore, it is possible conveniently to form relatively short interconnection wires, for example having a length of $2d$ to $3d$.

Particularly when the means for weakening the wire is mounted externally of the bonding head, it is preferred that the method of forming interconnection wires includes the step of moving the bonding head away from the contact before the step of weakening the wire. The length of the interconnection wires may be selected by controlling the distance through which the bonding head is moved, for example by use of a stepping motor.

The nature of the bonding head will be determined according to the nature of the bond to be made thereby. When the bonding head is for making a ball bond, it will generally be a "capillary". When the bonding head is for making a wedge bond, it will generally be a "wedge", these terms having recognised meanings in the art.

The invention also provides an electronic component having an interconnection wire bonded to a contact thereon without the use of a material other than the materials of the contact and the wire, the length of the interconnection wire, measured from the contact or, if a portion of the interconnection wire is broadened in the vicinity of the contact, from a point immediately above any such broadening, being from about $2d$ to about $20d$ where d is the diameter of the interconnection wire.

The invention further provides an assembly of first and second electronic components each having a contact, the contact being interconnected by an interconnection wire which:

(a) is bonded to the contact on the first component without the use of a material other than the materials of the wire and of that contact;

(b) is bonded to the contact on the second component by means of a conductive material that is different from the materials of the wire and of that contact.

The formation of interconnection means from wire has many advantages over pedestals formed by deforming gold spheres. For example, interconnection wires have a substantially constant cross-section which allows a more even stress distribution over their length compared with a moulded pedestal which has to be tapered over its entire length in order to be removable from its mould. A constant cross-section also facilitates mechanical connection to the interconnection means. The distribution of stress over the entire length of the interconnection means is desirable since it allows a greater strain to be withstood. Significant advantages also arise from the metallurgical structure of a wire compared with that of a moulded pedestal. A wire is work-hardened as a result of the process by which it is made. This ensures that interconnection means made from wire are capable physically of supporting an electronic component while also being sufficiently compliant to withstand thermally induced stresses between the component and a substrate to which it is connected. In contrast, moulded pedestals will tend to be relatively soft as a result of the annealing to which they are subjected during the moulding process. The structure of the metal of moulded pedestals will also tend to be generally more flawed, and to have a coarser grain, than that of wire. Moulded pedestals will therefore tend to be less capable of withstanding thermally induced stresses without breaking at a point of weakness provided at a flaw; furthermore, the electrical properties of interconnection wires will be superior to those of moulded pedestals because of their more refined structure.

The reproducible and reliable mechanical and electrical properties of interconnection means formed from wire therefore confer significant advantages on the interconnection technique provided by the present invention.

Preferably the method includes the step of applying to the bond between the interconnection wire and the contact on the first component, and to the surface of the component at least in the vicinity of the bond, a layer of an insulating material through which the wire extends in a direction away from the said surface.

In another aspect, the invention provides an electronic component having at least one contact on a surface thereof, the contact having an interconnection wire bonded thereto without the use of a material other than the materials of the contact and the wire and extending in a direction away from the said surface, the bond between the wire and the contact, and the surface of the component at least in the vicinity of the contact, being coated with a layer of an insulating material through which the wire extends.

The provision of a layer of insulating material has the advantage that the conductive material that is used to make the bond between the interconnection wires and the second component is prevented from wicking along the wires into contact with contacts on the first component where it could cause a short circuit between such contacts. The problem which the insulating layer overcomes is believed to be peculiar to the interconnection technique of the present invention since the small scale and configuration of the interconnections means that wicking of a material such as solder is more prevalent.

A further significant advantage of the component having a layer of an insulating material is that, in effect, it comprises a packaged component in which:

(i) each contact on the component has an interconnection wire bonded thereto, to allow connections to be made to contact on other components; and (ii) the bonds between the interconnection wires and the contacts, and sensitive surface regions of the component, are sealed against ingress of contaminants.

A packaged component therefore has the advantage that it can be operated on in environments other than "clean room" environments, for example for testing of the component and for shipping. The use of interconnection wires formed by the method of the present invention allows a packaged component to be made having a smaller size than has hitherto been possible. Indeed the area occupied by the packaged component need be no greater than the area of the component itself. This is a significant and highly desirable aspect of the present invention.

The layer of insulating material may also serve to support the interconnection wires laterally, in particular, to provide strain relief at the base of the wires.

Preferably, the layer of insulating material is sufficiently thick to cover the bond between the wire and the contact together with any broadened end portion of the wire associated with the bond, and especially that it extends along the constant cross-section portion of the wire, for example by at least 25 microns. It is preferred that the thickness of the layer is at least 15 microns, especially at least 50 microns.

The layer of insulating material may be applied in layers. This has the advantage that pin-holes in a single layer are blocked.

The layer of insulating material may be applied as a curable liquid. It may be applied in drops, and the drops may then be encouraged to flow over the surface of the component by agitation, for example by spinning the component or by vibrating it.

The invention also provides a method of forming an interconnection wire on each of at least two contacts on an electronic component, in which each interconnection wire is formed on its respective contact by the method of forming an interconnection wire described above, and which includes the step of applying force to each wire in a direction away from the bond to the contact, the direction in which force is applied to each wire being substantially parallel to the direction in which force is applied to the or each neighboring wire.

In a further aspect, the invention provides a method of interconnecting contacts on first and second components, comprising:

(a) forming an interconnection wire on a contact on the first component by a method as described above; and (b) bonding the free end of the interconnection wire to a respective contact on the second component.

Preferably the bond between each interconnection wire and its respective contact on the second component is made by means of a conductive material which is different from the materials of the wire and of the contact. The conductive material may exist as a fluid or may otherwise be deformable at ambient temperature, for example a conductive liquid, grease or gel, where necessary retained in place by a cover or a container. More preferably, the conductive material is a material which can be used to form a bond once heat has been applied thereto, for example a solder, a brazing material or a heat-activatable adhesive. Thus, it is preferred that the conductive material is fusible and is located in discrete quantities on each of the contacts or the second component, the bond being made by heating the conductive material to cause it to fuse and inserting the free end of the interconnection wire (which is bonded to the contact on the first component) into the fused conductive material.

Preferred solder materials include In/Pb and Au/Sn alloys.

Formation of the bond between the wire and the contact on the second component using a conductive material has the advantage that the bond to the second component can be made and unmade repeatedly and conveniently without affecting the bond between the wire and the first component, thereby allowing the first component to be disconnected from the second component, for example for repair or replacement. This is very much more difficult to achieve with interconnections made by means of "bumps", since the connections between a bump and first and second components usually have the same nature; for example, they are usually both welds or both solder connections. To disconnect a component that is connected by an interconnection wire with a wire bond at each end, it is necessary to cut the wire. The wire may then be too short to remake the connection, and it is extremely difficult to ensure that loose wires, attached to contacts on the first component, are connected to the correct contacts on the second component. Because of these and other difficulties, reconnection of components whose interconnection wires have been cut is not usually attempted: both the first and second components are usually discarded and replaced, which can involve significant expense, particularly when one of the components comprises a substrate on which several other components have already been mounted. The present invention removes the need for a wire bond at each end of the interconnection wire, thereby overcoming the problems of repair encountered with the prior art wire bonding technique. By severing the interconnection wires formed by the present method to a substantially constant length, there is no requirement to use a conductive material in which the material of the interconnection means dissolves, as taught in U.S. Pat. No. 3,373,481. Indeed it is preferred to use a conductive material in which the material of the interconnection wires is substantially insoluble since this allows the bond o each wire to be remade repeatedly without erosion of the wires.

In yet another aspect, the invention provides a method of forming an interconnection between contacts on first and second electronic components, which comprises:

(a) bonding a wire to a contact on the first component without the use of a material other than the materials of that contact and that wire;

(b) severing the wire to a desired length; and (c) connecting the free end of the wire to a contact on the second component by means of a conductive material which is different from the materials of the wire and of that contact.

Preferably the conductive material is located in a recess on the contact on the second component.

The use of conductive material to form the bonds between the interconnection wires and the second component has the advantage that it is able to compensate for any small variations in the length o the wires, and for any deviations in the planarity of the surface of one or both of the components on which the contacts are arranged. This ability is enhanced further by locating the conductive material in a recess. The present invention provides a second component which is provided with such discrete quantities of conductive materials, as "pools".

Accordingly, the invention provides an electronic component having at least one contact on a surface thereof, and a quantity of a fusible conductive material located on the contact in a recess, the ratio of the depth of the quantity of conductive material to the transverse dimension at the exposed surface thereof being at least about 0.25.

The recess may be formed in the contact. Alternatively or in addition, the recess may be defined by a layer of insulating material which is located on the surface of the component around, and at least in the vicinity of the contact. The layer of insulating material may be an integral part of the component, for example when the contact itself is recessed below the surrounding surface of the component.

The transverse dimension of the pool of conductive material will be its diameter when it is circular in cross-section. When the cross-section is non-circular, the transverse dimension will be the diameter of a circle of equivalent cross-sectional area. The depth and transverse dimension of the pool of conductive material are measured at the center of the recess.

It is preferred that the ratio of the depth of the pool of conductive material to its transverse dimension is at least about 0.50, especially at least about 1.00. In components in which the value of this ratio is a least 0.25 or higher, the surface density of the pools of conductive material, and therefore also of interconnections to the component, can be kept high while also compensating for variations in the lengths of the interconnection wires.

The provision of pools of conductive material in recesses has the advantage that interconnection wires can be aligned with the pools of conductive material by the opening of the recess.

Preferably, the recess is tapered inwardly. This further enhances correct alignment of the interconnection wires in the pools of a conductive material. To complement the inward taper in the recess, it is preferred that the interconnection wire is tapered over a short distance at its free end.

When the conductive material comprises a solder, it is preferably supplied to the recesses in particulate form, for example as a powder or in the form of small spheres. The powder may be supplied in the form of a paste comprising the solder particles together with a flux and preferably also a solvent. The paste is inserted into a recess. Volatile components of the paste, especially any solvents present therein, are then removed by heating. Subsequently the flux is removed to leave a pool of solder in the recess on the contact. When the solder is supplied in the form of spheres, it is preferred initially to supply a single sphere to each recess, having a transverse dimension such that it can sit in the recess and contact the base of the recess, preferably less than about 0.75 times the transverse dimension of the recess at its base. Subsequently, additional spheres of solder may be supplied to increase the depth of the solder pool. A flux should generally be added with at least the initial solder sphere. The quantity of flux should preferably be enough to provide a coating on the solder sphere and on the contact (which is at the base of the recess), but not so much as to fill completely the space between the the sphere and the walls of the recess, so as to cover the sphere. The use of spheres of solder is particularly preferred for replenishing pools of solder after interconnection wires have been removed therefrom in order to disconnect the components, since it conveniently allows the amount of added solder to be controlled.

DESCRIPTION OF PREFERRED EMBODIMENTS

Figure 1:
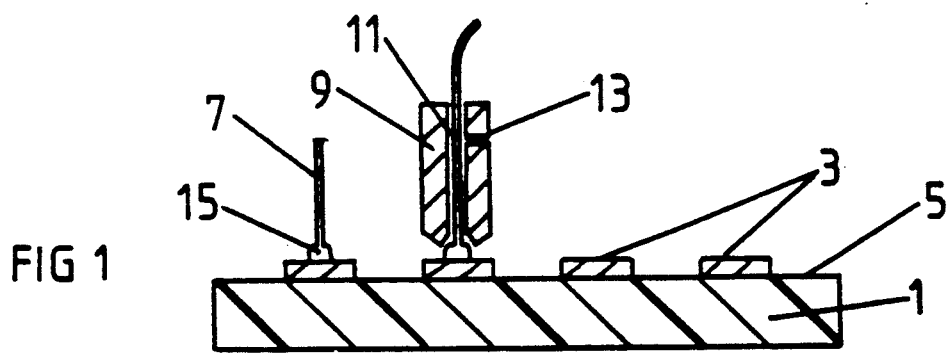
FIG. 1 is a sectional elevation of an electronic component, such as an integrated circuit chip, to which an interconnection wire is being bonded by means of a thermocompression wire bonder.

Referring to the drawings, FIG. 1 shows an electronic component 1 such as an integrated circuit chip having contacts 3 on a principal surface 5 thereof. Interconnection wires 7 are bonded to the contacts; one of the wires is shown in the process of being bonded to its respective contact by means of a wire bonder, of which only the capillary bonding head 9 is shown The bonding head has a through passage 11 through which the wire is supplied for bonding to the contacts on the component. The bonding head has an aperture 13 in its side wall which communicates with the through passage 11 for housing means for weakening the wire at a point a predetermined distance from the opening through which the wire leaves the through passage. Once the wire has been bonded to a contact, it is severed at a point a distance of from $2d$ to $20d$ above the ball 15 through which the wire is bonded to the contact, where $d$ is the diameter of the wire. Preferably the wire is severed by applying force to the wire in a direction away from the contact so that it breaks at a point at which it has been weakened.

Figure 2:
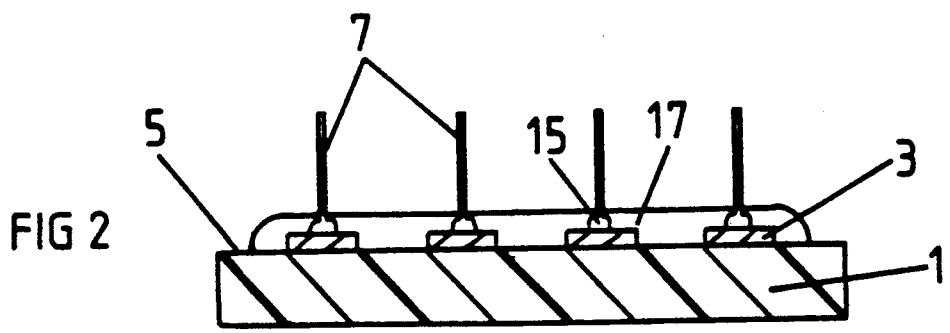
FIG. 2 is a sectional elevation of the IC chip shown in FIG. 1, having interconnection wires bonded to each contact.

FIG. 2 shows the component 1 having interconnection wires 7 bonded to each of its contacts 3. Each of the wires has been severed so that the wires are all of substantially equal length. A layer 17 of an insulating material has been applied to the surface 5 of the component so as to encapsulate the bonds between the wires 7 and the contacts 3, including the balls 15 formed on the ends of the wires through which they are bonded to the contacts. A layer having the configuration shown in FIG. 2 may be of a relatively inflexible polymer such as one which is at least partly crystalline.

Figure 3:
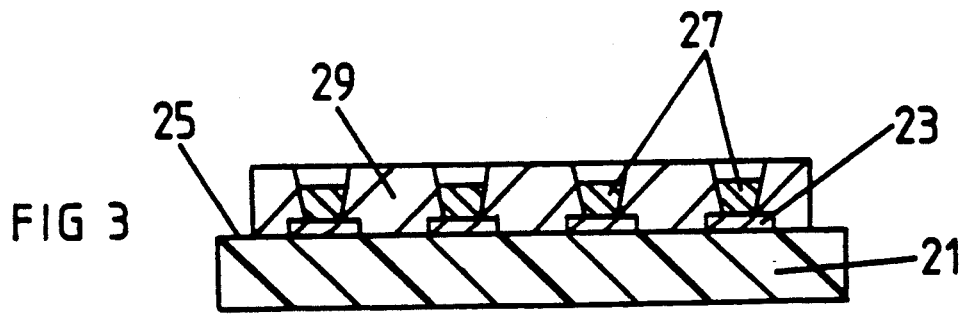
FIG. 3 is a sectional elevation of an electronic component such as an IC chip carrier having a discrete quantity of a conductive material such as a solder located in a recess on each contact thereon.

FIG. 3 shows an electronic component 21, such as an IC chip carrier, having contacts 23 on a principal surface 25 thereof. Pools 27 of conductive material such as solder are provided one on each contact 23. Each of the pools is located in a recess in a layer 29 of insulating layer which is located on the surface 25 of the component around each of the contacts 23. The ratio of the depth of each pool 27 of conductive material to its transverse dimension is at least 0.25.

The transverse dimension of each recess is greater at the outer surface 31 of the layer 29 of insulating material than at the surface which contacts the surface 25 of the component 21, so that the recess is tapered inwardly towards its respective contact 23. The taper of the recess helps to align the interconnection wires in the pools 27 of conductive material. This alignment can be further enhanced by severing each interconnection wire 7 on the component 1 such that it is tapered over a short distance at its free end.

Figure 4:
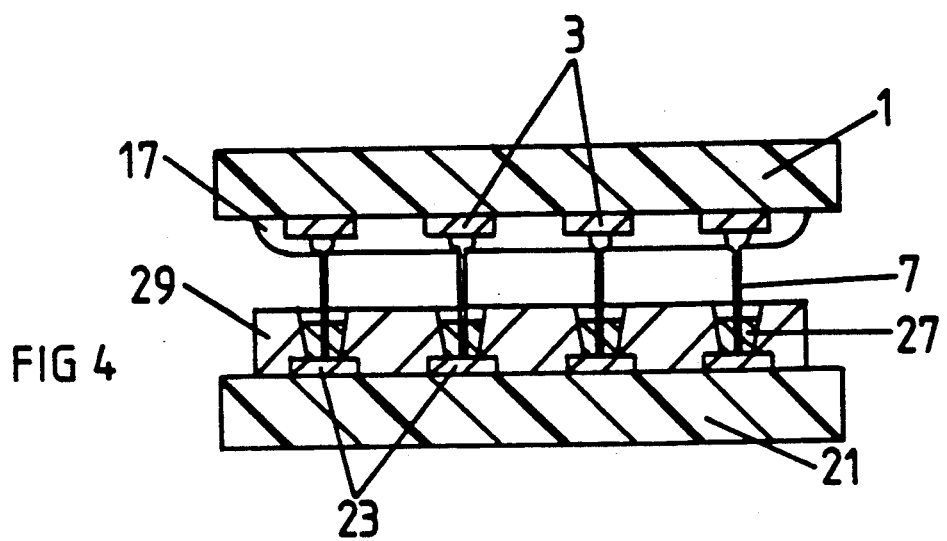
FIG. 4 is a sectional elevation of the electronic components shown in FIGS. 2 and 3 interconnected by means of interconnection wires.

FIG. 4 shows the first component 1, shown in FIG. 2, and the component 21, shown in FIG. 3, interconnected by means of the interconnection wires 7 which are bonded to the contacts 3 on the first component 1 as described above, and are connected to the contacts 23 on the second component 21 by means of the conductive material of the pools 27. When the conductive material is fusible, for example a solder, the connection of the wires 7 to the contacts 23 on the second component 21 is made by applying heat to cause the conductive material to fuse, and inserting the free ends of the wires 7 into the fused material.

Figure 5:
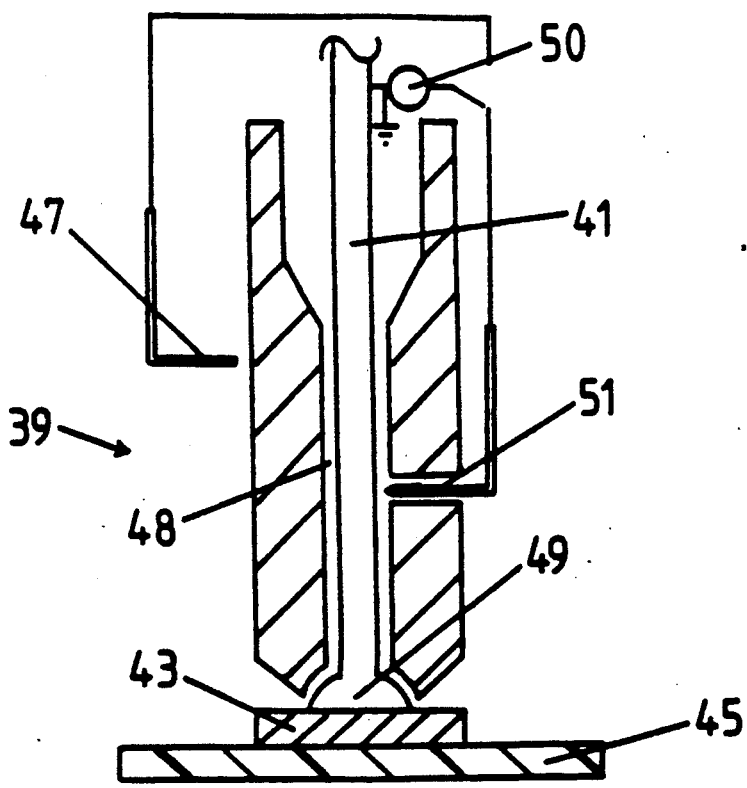
FIG. 5 is an enlarged view of a bonding head of a wire bonder in use forming an interconnection wire on a contact on an electronic component.

FIG. 5 shows schematically a capillary bonding head 39 of a wire bonder in use forming a bond between the end of a wire 41 and a contact 43 on a surface of a component 45. The wire bonder comprises an electrode 47 for generating an arc between it and the end of the wire 41 which protrudes from the through passage 48 in the bonding head 39 when in a raised position (not shown). The electrode 47 serves to form a ball 49 on the end of the wire 41 by causing the material of the wire to fuse. The electrode is connected through a D.C. power source 50 to the wire 41.

After the ball 49 has been formed on the end of the wire 41, the bonding head 39 is lowered, past the ball forming electrode 47, to apply heat and pressure to form a bond between the ball 49 and the contact 43. The bond is formed without the use of a material other than the materials of the wire and the contact, apart from incidental amounts of materials such as surface preparation agents, reaction products and contaminants.

Figure 6:
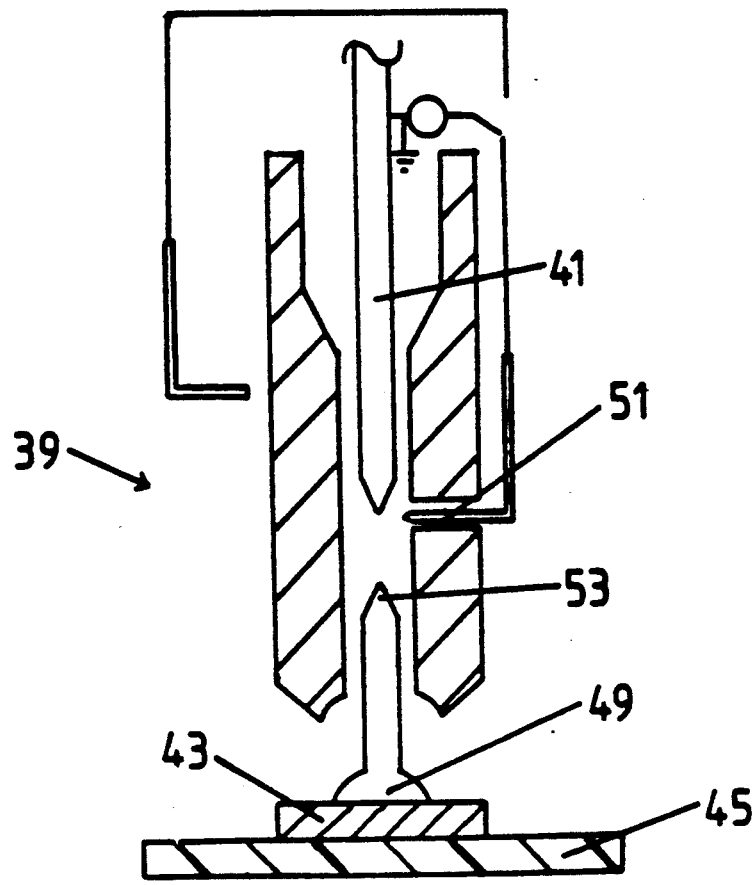
FIG. 6 shows the bonding head shown in FIG. 5 being lifted from the contact, leaving an interconnection wire bonded to the contact.

Once the bond between the ball 49 and the contact 43 has been made, the wire 41 is broken by gripping the wire within the wire bonder and applying a force to the wire in a direction substantially perpendicular to the contact 43 at the point at which the wire 41 is bonded thereto. As shown in FIG. 6, the force is applied by gripping the wire 41 and raising the wire bonded including the bonding head 39 form the contact 43. In some circumstances it can be advantageous to apply the force to the wire by means of jaws which grip the wire and which are movable relative to the bonding arm. For example, the jaws may be mounted on a resilient arm which is capable of moving the jaws relative to the bonding arm so as to apply a reproducible force to the wire (which is bonded at its free end to the contact 43 via the ball 49).

The wire is made to break under the applied force by weakening it at a desired point. For this the bonding head is provided with an electrode 51 in an aperture in the side wall of the head which communicates with the through passage 48. The electrode 51 is connected to the wire 41 through the power source 50.

On each side of the aperture in which the electrode 51 is located, the internal diameter of the through passage 48 is arranged to be constant over a distance which is greater than 2.5x where x is the internal diameter of the passage at the point where the aperture and the passage meet. This allows the wire 41 to be cut more reproducibly to a desired length since its ability to move laterally in the passage is minimized; the arc between the electrode 51 and the wire 41 will therefore be shorter and more controllable.

The combination of force and the arc between the wire 41 and the electrode 51 produces an interconnection wire on the contact 43 that is tapered over a short distance 53 at its free end.

What is claimed is:

1. An assembly comprising first and second electronic components in opposing face-to-face relationship, each component having a plurality of contacts, pairs of contacts on the first and second components respectively being interconnected by individual interconnection wires extending between contacts on the opposing faces of the two components, each of said wires
   (a) being bonded to the contact on the first component without the use of a material other than the materials of the wire and of that contacts, and
   (b) being bonded to the contact on the second component by means of a conductive material that is different from the materials of the wire and of that contact.

2. An assembly as claimed in claim 1, in which there are at least three rows of interconnection wires bonded to respective contacts between any two opposite edges of either component.

3. An assembly as claimed in claim 1, in which each of the interconnection wires is substantially straight.

4. An assembly as claimed in claim 1, in which the bond between said interconnection wires and the respective contacts on the first component is a weld.

5. An assembly as claimed in claim 1, in which a portion of said interconnection wires is broadened in the vicinity of the respective contacts on the first component.

6. An assembly as claimed in claim 1, in which the bond between said interconnection wires and the respective contacts on the first component is formed by ball or wedge bonding.

7. An assembly as claimed in claim 1, in which said interconnection wires have a substantially constant cross-section.

8. An assembly as claimed in claim 1, further comprising a layer of an insulating material applied to the bonds between said interconnection wires and the respective contacts on the first component and to the surface of the first component in the vicinity of the bonds, through which said interconnection wires extend in a direction away from said surface.

9. An assembly as claimed in claim 8, in which the layer of insulating material is sufficiently thick to cover the bonds between said interconnection wires and the respective contacts on the first component together with any broadened portion of said interconnection wires associated with the bonds.

10. An assembly according to claim 1, wherein the interconnection wires are substantially perpendicular to the first component.

11. An assembly according to claim 1, wherein the interconnection wires are tapered at the end thereof bonded to the contact on the second component.

12. An assembly according to claim 1, wherein the interconnection wires are work-hardened.

13. An assembly according to claim 1, wherein the interconnection wires have a diameter of from about 12 to about 125 microns.

14. An assembly according to claim 1, 3, 12, or 13, wherein the length of each interconnection wire is between 3 and 12 times its diameter.

15. An assembly according to claim 1, 11, 12, or 13, wherein the conductive material is located in recesses in an insulating layer on the surface of the second component.

16. An assembly according to claim 15, wherein the recesses are inwardly tapered.

* * * * *